US011903173B2

(12) United States Patent
Gao

(10) Patent No.: US 11,903,173 B2
(45) Date of Patent: Feb. 13, 2024

(54) AIRSIDE ECONOMIZER SYSTEM DESIGN FOR IT CLUSTER

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 566 days.

(21) Appl. No.: 17/003,536

(22) Filed: Aug. 26, 2020

(65) Prior Publication Data

US 2022/0071064 A1 Mar. 3, 2022

(51) Int. Cl.
*H05K 7/20* (2006.01)

(52) U.S. Cl.
CPC ..... *H05K 7/20836* (2013.01); *H05K 7/20181* (2013.01); *H05K 7/20745* (2013.01)

(58) Field of Classification Search
CPC ........... H05K 7/20836; H05K 7/20181; H05K 7/20745; H05K 7/20718; H05K 7/20145; H05K 7/20309; H05K 7/20327; H05K 7/20345; H05K 7/208
See application file for complete search history.

(56) References Cited

U.S. PATENT DOCUMENTS

2013/0005235 A1* 1/2013 Ootani ............... H05K 7/20836
454/184
2015/0369527 A1* 12/2015 Ghadiri Moghaddam ...................
F24F 3/1423
62/305

* cited by examiner

*Primary Examiner* — Ana M Vazquez
(74) *Attorney, Agent, or Firm* — WOMBLE BOND DICKINSON (US) LLP

(57) ABSTRACT

A modularized architecture for designing and implementing air side economization system is introduced. An airside economizer system operable in plurality of modes according to outside air temperature and quality. The system can be configured as a mixing module, an evaporative cooling module, and air supply module, attached to each other and having air passages there-between. The operational modes include a direct mode wherein the heat exchanger is deactivated and the plurality of blowers and plurality of louvers are activated to deliver ambient air to the load; an indirect mode wherein the heat exchanger is activated and the plurality of blowers and plurality of louvers are activated to deliver ambient air to the heat exchanger; and a mixing mode, wherein the heat exchanger is deactivated and the plurality of blowers and plurality of louvers are activated to mix ambient air with recirculated air.

14 Claims, 9 Drawing Sheets

AIRSIDE ECONOMIZER SYSTEM DESIGN FOR IT CLUSTER

FIELD OF THE INVENTION

Embodiments of the present invention relate generally to systems for data center cooling. More particularly, embodiments of the invention relate to airside economizer cooling system that is operable in different modes according to prevailing conditions of the ambient air and specific data center cooling requirements.

BACKGROUND

Cooling is a prominent factor in a computer system and data center design. The number of high performance electronic components, such as high performance processors, packaged inside servers has steadily increased, as the power of a single chip increases constantly, thereby increasing the amount of heat generated and dissipated during the ordinary operations of the servers. Therefore, energy efficiency is important especially due to the constant increasing heat dissipation. The reliability of the servers decreases if the temperature in the environment in which they operate is permitted to increase in over time. Maintaining a proper thermal environment and proper air quality is critical for normal operations of these servers, as well as the servers' performance and lifetime. Effective and efficient cooling solutions are needed especially in the cases of cooling high performance servers as well as general purpose compute servers.

In this document, mechanical cooling system involves the use of electric energy to power up one or more compressors for cooling the air inside the data center. Such systems circulate a coolant to transfer and remove heat from inside the data center. The coolant is either a phase changing fluid, e.g., using a refrigeration cycle, or a liquid, e.g., water cooling towers. In either case, some form of heat exchangers are used, which require application of electrical power to operate the active cooling system. In this respect, a heat exchanger is any device used to transfer heat between two or more fluids.

A system that uses ambient air and/or water directly or indirectly without using any mechanical cooling such as compressor is referred to as "free cooling" or cooling economization. These systems are able to switch between "mechanical" cooling to "free" cooling when the ambient temperature is sufficiently low. The basic concept is that the system shuts off the compressor or other active air cooling equipment, but the pumps and blowers continue to operate and pump outside air—optionally after filtering—directly into the data center. When the outside temperature rises, the system activates the air cooling equipment to provide active air cooling. An indirect air cooling operating without using compressor, such as in dry mode and wet mode is also considered as air side economization.

In general terms an economizer is a one of the components or a sub-systems in a cooling system. In reference to HVAC (heating, ventilating, and air conditioning) system, an airside economizer may be used to save energy costs by using outside (also referred to as ambient) air directly or indirectly to cool the indoor space without using any air conditioning compressor. When the outside air is both sufficiently cool and sufficiently dry, as well as in good quality, it may be pumped directly into the interior space, which is the mode referred to in the art as free cooling.

The temperature and quality of the ambient air changes over time and differs in different geographical locations. This variability in ambient air temperature and air quality complicates the design and operation of airside economizers.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The current disclosure provides an airside economizer system for IT cluster thermal management. The system consists of several modules that can be controlled and configured to form the system in different modes. The cooling system enables utilizing the outside air in different modes based on its dry bulb temperature, wet bulb temperature, humidity and quality conditions. In addition, in mixing operating mode, the outside air can be supplied to the IT cluster or data center directly and at the same time, used for cooling the data center internal recirculating air. The air supplied to the data center can be conditioned and treated outside air, internal recirculating air, or mix of outside and recirculated air by controlling the modules and the equipment to operate in different conditions and combination scenarios.

The disclosed embodiments can be used for configuring different types of cooling operations, depending on the particular requirements at a particular time. The disclosure first provides an overview of the system and follows by demonstrating the different airside economization configurations and corresponding different modes of operations.

Figure 1:
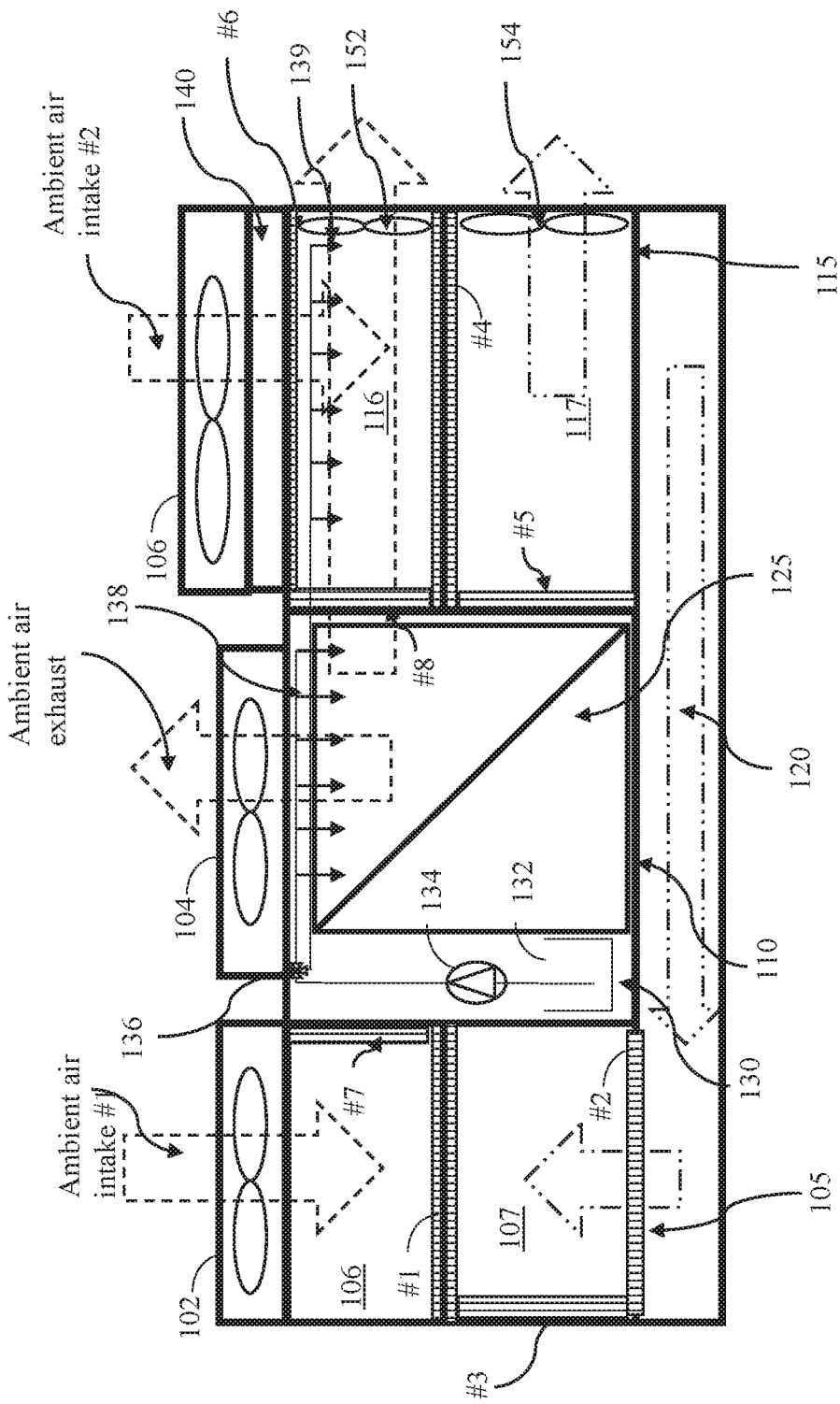
FIG. 1 is a schematic illustrating an example of a modular airside economizer, according to one embodiment.

FIG. 1 is a schematic illustrating the overall structure of an airside economizer system according to an embodiment. The entire system is a highly modularized, as it is assembled using several prefabricate modules. In this example, three prefabricated modules are connected to each other serially: a mixing compartment 105, an evaporative cooling compartment 110, and air supply compartment 115, forming a linear assembly. Also, in this particular example the three modules are assembled over a return air channel 120, and each of the modules includes a blower or fan, 102, 104 and 106. A plurality of motorized louvers are installed between different elements and are used to generate different air paths for different operational modes, as will be described more fully below. This avoids the need to design and fabricate different air ducts to generate different operating modes.

The three modules may be attached to each other and to the return air channel 120 in the factory, and delivered as a unitary system ready for installation at the site. Alternatively, each of the three modules may be fabricated at the factory as described, but not attached to each other until they arrive at the installation site. Since the modules include all the fluid ports, dampers, blowers, etc., they can be easily attached to each other at the site and then be ready for operation. Also, each of the three modules may have a housing that is of the same dimensions and the same form factor, and includes the appropriate interface for interconnecting the modules to each other and to the load. Still alternatively, all three modules may be provided within one general housing.

The mixing compartment 105 includes a housing having an upper enclosure 106 and a lower enclosure 107, separated by motorized louver #1. Blower 102 is operable as an intake blower to blow ambient air into the system via upper compartment 106. Return air channel 120 delivers hot air from the load into lower compartment 107, through motorized louver #2, which is installed between the mixing compartment 105 and the return air channel 120. Air louver #3 is installed at an exhaust opening from lower compartment 107 and, when opened, provides free flow passage between the lower compartment 107 and the ambient environment. Air louver #7 is installed in an opening between the upper compartment 106 and the evaporative compartment 110.

Incidentally, in FIG. 1, the hatch marks in air louvers #1 and #2 indicate an open position, while air louvers #3 and #7 are shown without hatch marks, indicating a closed position. This convention is employed for all of the figures presented herein. Also, some figures show louvers between a blower unit and an attached compartment; however, it is not mandatory to have such louvers. Some fans and/or blower arrangements do not permit air flow when not activated and, therefore, can be installed without louvers.

The evaporative cooling compartment 110 houses an air-to-air heat exchanger 125 and a water cooling system 130 used for evaporative cooling. Water cooling system 130 includes water reservoir 132, water pump 134, three-way valve 136 and evaporative nozzles 138. The three-way valve is operable to be shut, to provide a first flow path, e.g., to evaporative nozzles 138, or to provide a second flow path, e.g., to misting nozzles 139. Specific details of the water system design are not shown in FIG. 1, as any conventional water system may be used. Also, the specific positioning of the shown elements is for visualization only and may change. For example, the water reservoir 132 may be positioned below the heat exchanger 125, where it may collect excess water from the evaporative nozzles 138.

Blower 104 operates to pass ambient airflow through the air-to-air heat exchanger 125 as the cooling medium. The inlet for providing ambient air as cooling medium for the heat exchanger is from the side of the housing of the evaporative cooling compartment 110, which cannot be shown in this view, as will be explained further below. Lover #7 can be opened to provide supply of ambient air through the air-to-air heat exchanger 125 to the air supply compartment, but is not used as the cooling medium inside the heat exchanger 125. That is, the evaporative cooling compartment 110 includes a first air passage defining fluid path from the ambient air inlet on the side of the housing, through the heat exchanger 125 and to the blower 104, and a second air passage defining fluid path from the mixing module 105, through the heat exchanger 125, to the air supply module 115. Note however, that within the heat exchanger 125 the two paths have no fluid communication to each other, thereby preventing air from these two paths from mixing.

The housing of the air supply compartment 115 is divided by motorized louver #4 into an upper air compartment 116 and lower air compartment 117. Water misting nozzles 139 are positioned within the upper air compartment 116. Also, chemical filtration system 140 is positioned between the blower 106 and the upper air compartment 116 to filter ambient air delivered by blower 106. In this example, air supply compartment 115 also includes optional fan or fan wall systems 152 and 154, which deliver cooled air to the load.

The embodiment illustrated in FIG. 1 can be configured in different modes and operated in various modes depending on the ambient air temperature and quality and the requirements imposed by the load, as well as actual use case and corresponding requirements. The operational modes can be changed by activating specific elements of the system, while deactivating other elements. For example, in different modes different blowers would be activated or deactivated, and their spinning direction may also change. Also, in different modes different louvers would be either closed, partially open, or fully open to generate air flow path bespoke to the particular operating mode. The mechanical cooling elements may be activated for some operational modes, while deactivated for other operational modes. Importantly, changing the operational mode does not require physically replacing any element or component of the system. The following will provide some descriptions on how each mode is configured and operated. Since the following Figures illustrate the same system as shown in FIG. 1, only references relevant to the description will be repeated.

Figure 2:
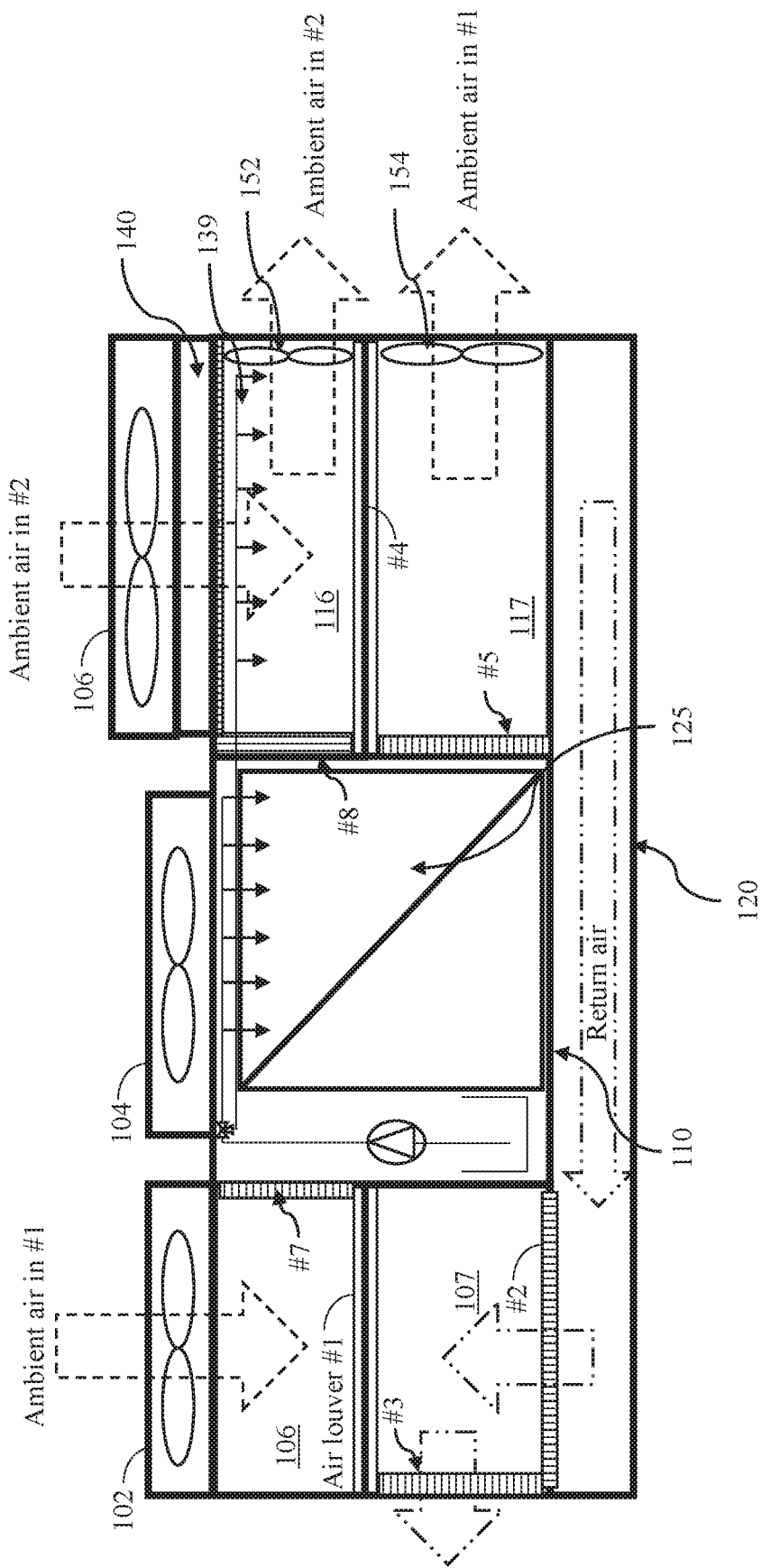
FIG. 2 is a schematic illustrating an example of a free cooling system, according to one embodiment.

As noted, when the outside air temperature and quality is acceptable for directly cooling the load, it is referred to as free cooling. FIG. 2 illustrates the system operation mode for direct free air cooling. FIG. 2 illustrates three different options, which may be operated simultaneously or selectively. First, some data centers or clusters may have separate ducting to exhaust the hot air independently of the cooling system. In these applications, no air is exhausted through the cooling system. If such ducting does not exist, or is not used, the hot air may be exhausted through the system. This is shown by the hot air flowing through the return air channel 120, through louver #2 into lower chamber 107, and thence through louver #3 to the outside environment (see double-dot arrows). This path is optional, and when not required louvers #2 and #3 may remain closed.

The other two options illustrated in FIG. 2 relate to the delivery of ambient air to the load (IT cluster or data center). Which option is selected depends on the quality of the ambient air and the requirements of the IT equipment. The two options provide two ambient air paths, wherein either path may be operated independently and the air from each path may be used to cool different loads having different air quality requirements. A first ambient air path is formed by blower 102 blowing ambient air from the surrounding outside environment into the upper chamber 106. The blown air exits upper chamber 106 via louver #7 and passes through the evaporative compartment 110 and thence through louver #5 into lower chamber 117. From lower chamber 117 the air is supplied to the load, optionally using fans or fan wall 154. Note, however, that the equipment inside evaporative compartment need not be operated, such that no conditioning of the ambient air is implemented in this path.

The second ambient air path provides filtered air path. Specifically, the ambient air supplied by blower 106 is filtered by the chemical filtration system 140. The filtered air then enters upper chamber 116 where, optionally, the humidity in the air is increased by water misting nozzle 139. The air is then provided to the load, optionally using fan or fan wall 152. In another embodiment, air can be mixed in upper chamber 116 and lower chamber 117.

Figure 3:
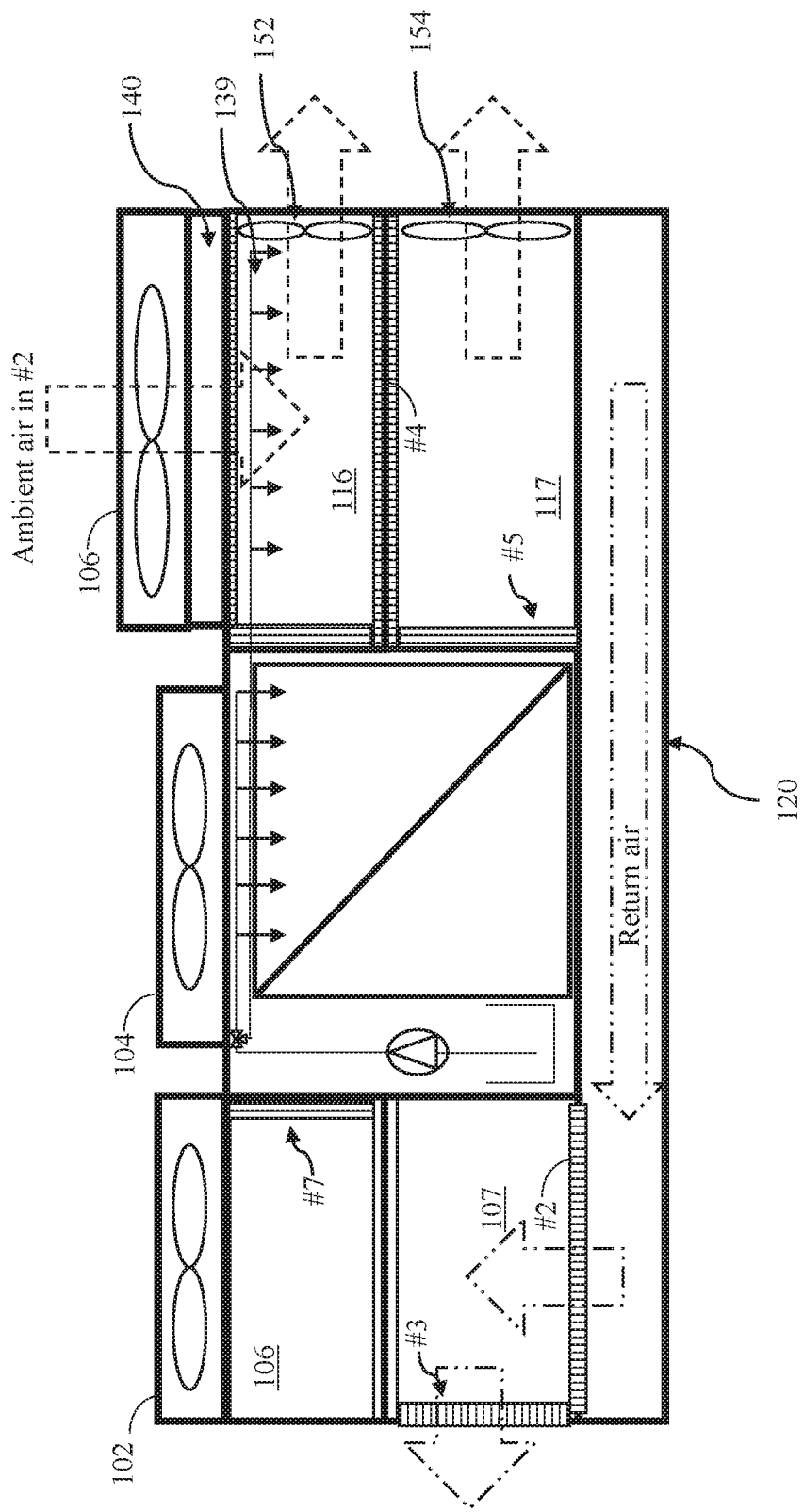
FIG. 3 is a schematic illustrating an example of free cooling system, according to another embodiment.

When the ambient air quality is acceptable, both ambient air paths shown in FIG. 2 can be used, or only the path from blower 102 may be used, thereby reducing operational costs associated with the chemical filtration system 140. In some embodiments, the path through the filter 140 may be used for load requiring high quality air, while the direct path through lower chamber 117 may be used for less sensitive applications requiring less stringent air quality. On the other hand, if the air quality is unacceptable for the load, then only the path through the upper chamber 116 may be used. Such a mode is illustrated in FIG. 3. Regardless, in any of these operational modes the ambient air is supplied directly to the load without any active cooling.

In FIG. 3, the return air follows the same path as in the mode shown in FIG. 2. On the other hand, blower 102 is inactivated and louvers #7 and #5 are closed, such that there is no ambient air flowing from chamber 106 to lower chamber 117. Conversely, blower 106 is operational and delivers ambient air through the chemical filtration system 140. The filtered air may pass through only upper chamber 116 to the load, or, if louver #4 is opened, through both upper chamber 116 and lower chamber 117 to the same or different loads. Also, if the air is too dry, the water misting nozzle 139 may be activated to add humidity to the air.

Figure 4:
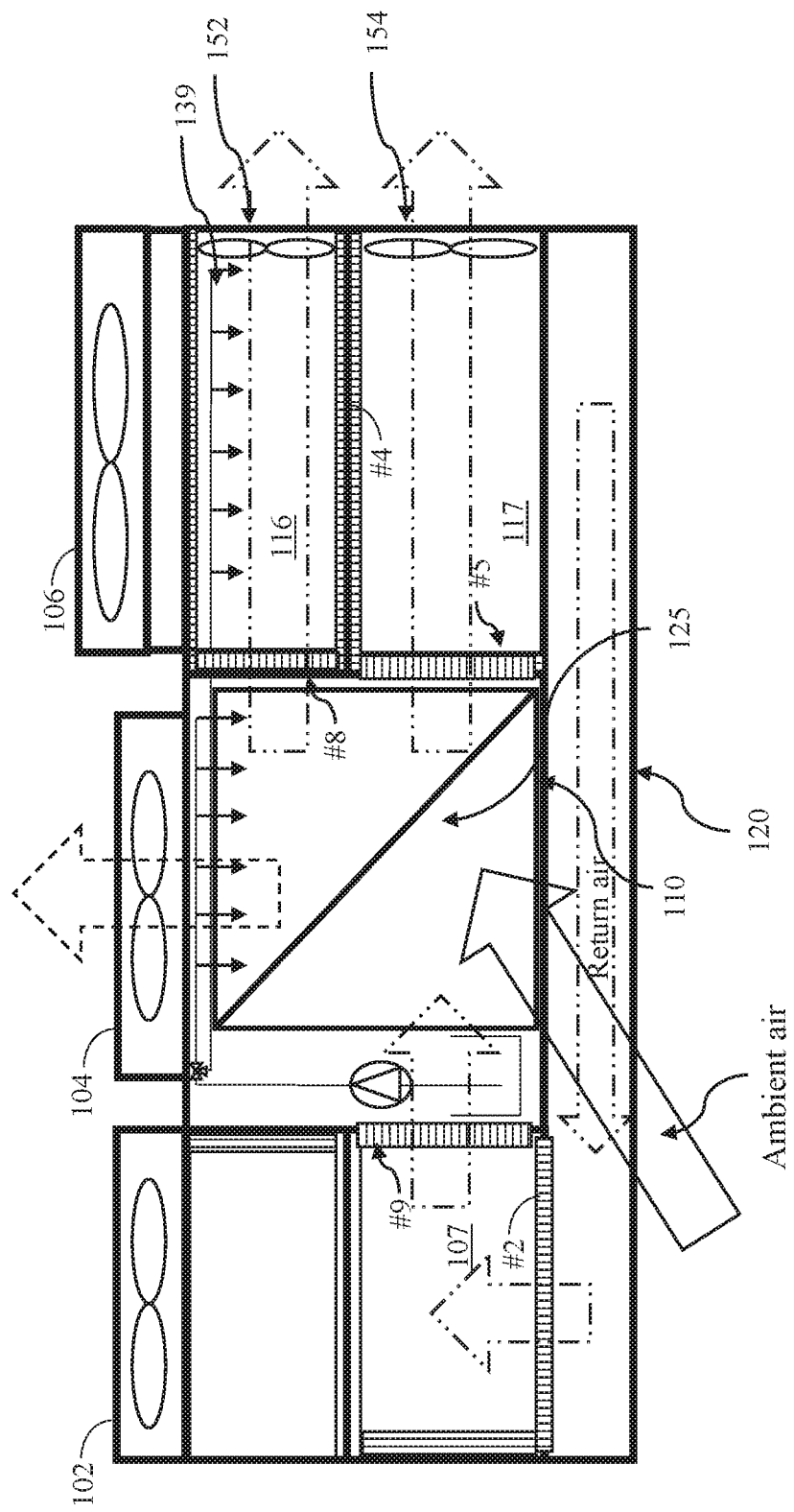
FIG. 4 is a schematic illustrating example of indirect evaporative cooling system, according to one embodiment.

When the ambient air temperature and/or quality is not acceptable for direct application to the load, it may still be used as a cooling medium in a heat exchanger. This indirect air cooling mode is illustrated in FIG. 4. In this operating mode, only blower 104 is working and it is pumping ambient air from the outside through the air-to-air heat exchanger 125 in the evaporative compartment 110. Note that the ambient air is pumped through an inlet provided on the side of evaporative compartment 110, which cannot be illustrated in this view as it is in a third dimension (into the page), so it is represented schematically by a slanted arrow.

In this mode, the air received from the return air channel 120 is cooled in the air to air heat exchanger 125 and is then recirculated into the load via fans 152 and/or 154. In this mode, water cooling system 130 may operate to enhance heat exchange efficiency. This operation can be either a dry bulb operating mode or a wet bulb operating mode. The path for the recirculated air is formed by opening louvers #2,#5, #8 and #9. Optionally, louver #4 may also be opened. The remaining louvers are closed. If needed, in some cases the water misting nozzle 139 might be activated to add humidity to the recirculated air, such as when the air is not used directly to cool electronic components.

Figure 5:
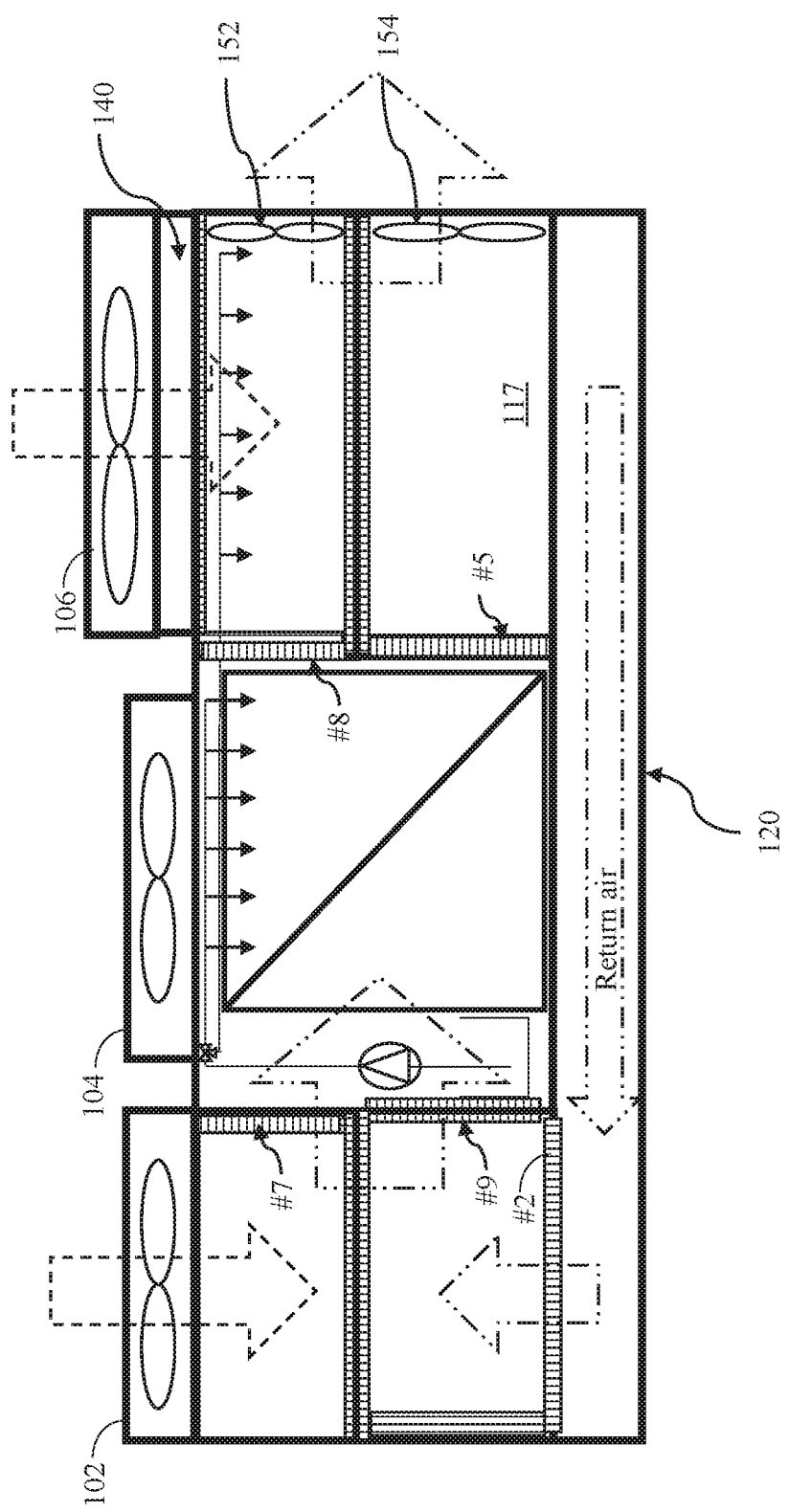
FIG. 5 is a schematic illustrating an example of a mixing mode of operation, according to an embodiment.

In environments where the outside air is very cold, the ambient air may be used to directly lower the temperature of the recirculating air by mixing. Such an operational mode is illustrated in FIG. 5. This mixing mode is particularly suitable for operation during an extreme low ambient temperatures. In this scenario, the data center return air is mixed with the outside cold air such that no mechanical cooling is needed and the air-to-air heat exchanger 125 is not operating. Rather, the hot return air from return air channel 120 is mixed with the extremely low temperature outside air that is delivered by blower 102 and or 106, and the mixture is then supplied to the load by fans 152 and/or 154.

There are multiple mixing scenarios that can be executed depending on the circumstances. For example, if air quality is acceptable, but high volume of cold air is needed for the cooling, then both blowers 102 and 106 may be operated to deliver ambient air. Conversely, if the ambient air quality is low, but the temperature is sufficiently low to provide cooling from a single blower, then ambient air may be delivered only by blower 106. On the other hand, if quality is acceptable and temperature is sufficiently low to provide cooling from a single blower, then only blower 102 may be operated, thereby reducing cost associated with the maintenance of filter 140. The air mixing can be designed in either compartment.

Figure 6:
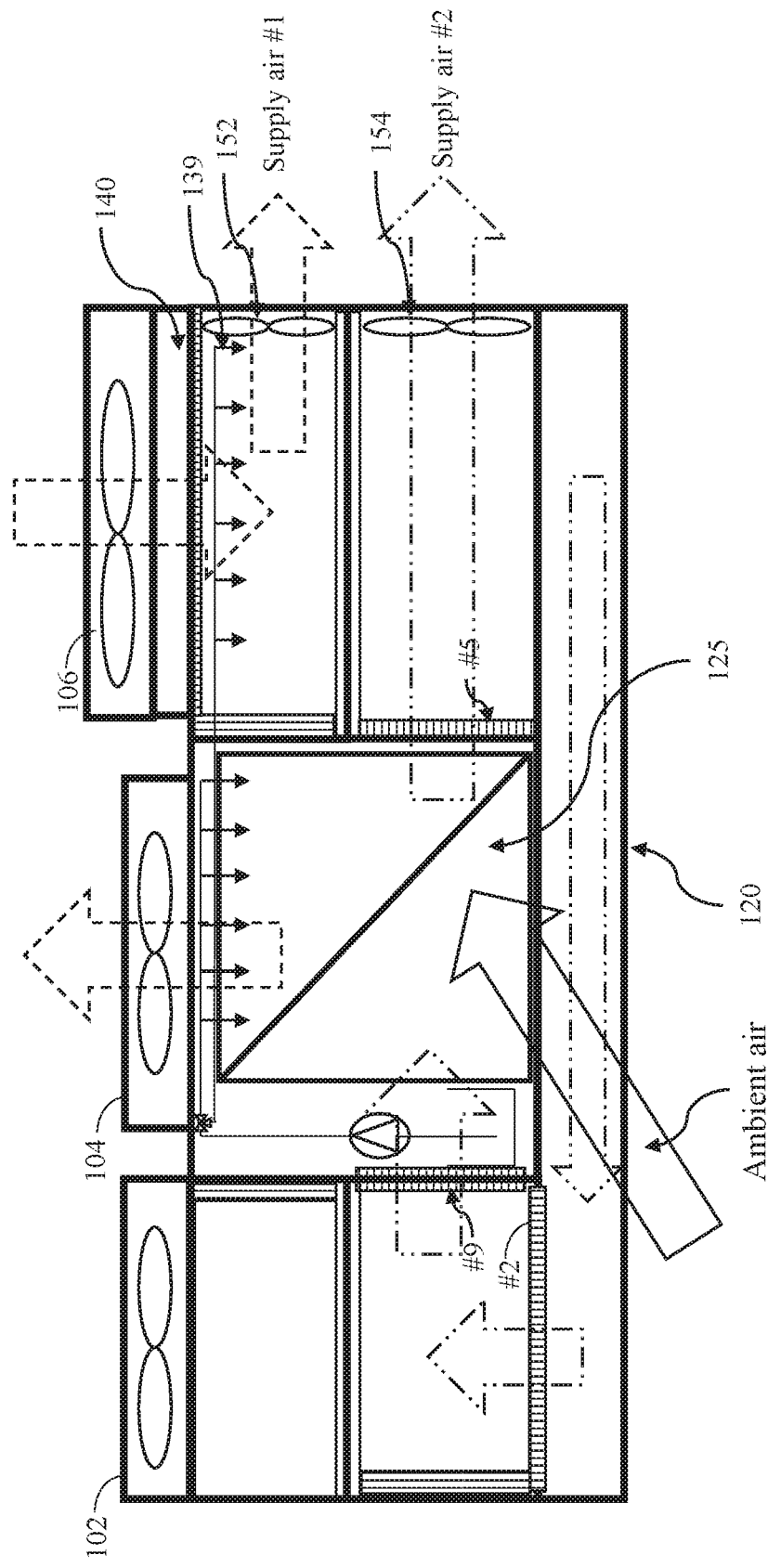
FIG. 6 is a schematic illustrating another example of mixing mode of operation, according to an embodiment.

Rather than mixing the return air and ambient air inside the cooling system, the return air may be recirculated and ambient air delivered to the load separately. Such a hybrid mode is illustrated in FIG. 6, wherein ambient air is used for direct cooling through one flow path and indirect cooling through a second flow path. Such an operational mode is particularly effective when the outside air quality is poor, but its temperature is sufficiently cold or appropriate to be used to function as a cooling medium.

The return air path is formed by opening louvers #2, #5 and #9, so that the return air from return air channel 120 passes through the heat exchanger 125. Blower 104 operates to pass ambient air from the side intake through the heat exchanger 125 and out to the atmosphere. That is, the ambient air pumped by blower 104 does not enter the IT container or data room. Rather, the return air is delivered to the IT container or data center by fan 154 after being cooled in the heat exchanger 125.

Additionally, ambient air is pumped in by blower 106, and is filtered by filter 140. It is then delivered to the IT container or data center by fan 152. If needed, water mist 139 may be used to control the humidity of the air. In this mode, the cooled-recirculated air and the filtered ambient air can be supplied to different loads in the IT cluster or in the data center. In one embodiment, the supply air #1 and supply air #2 are used for different parts of load, and the return air in 120 is from the supply air #2, while the exhaust of the supply air #1 is not shown in the in Figure, as it uses the exhaust provided in the IT cluster.

This mode is beneficial when the ambient air quality is not good enough for contacting IT equipment and electronics directly, but is sufficiently good for cooling other non-IT equipment. Therefore, the filtered ambient air is supplied separately from the recirculation air, so that it can be used separately for non-IT equipment. This leverages the availabilities of outside air directly for thermal management of non-IT loads. This not only improves the system efficiency, but also the system operating flexibilities. In addition, the availabilities of the system is significantly improved, and it can be deployed in different regions and weather conditions. Moreover, the system can also be used in backup cooling mode in which the outside air is used as the only available cooling source.

Figure 7:
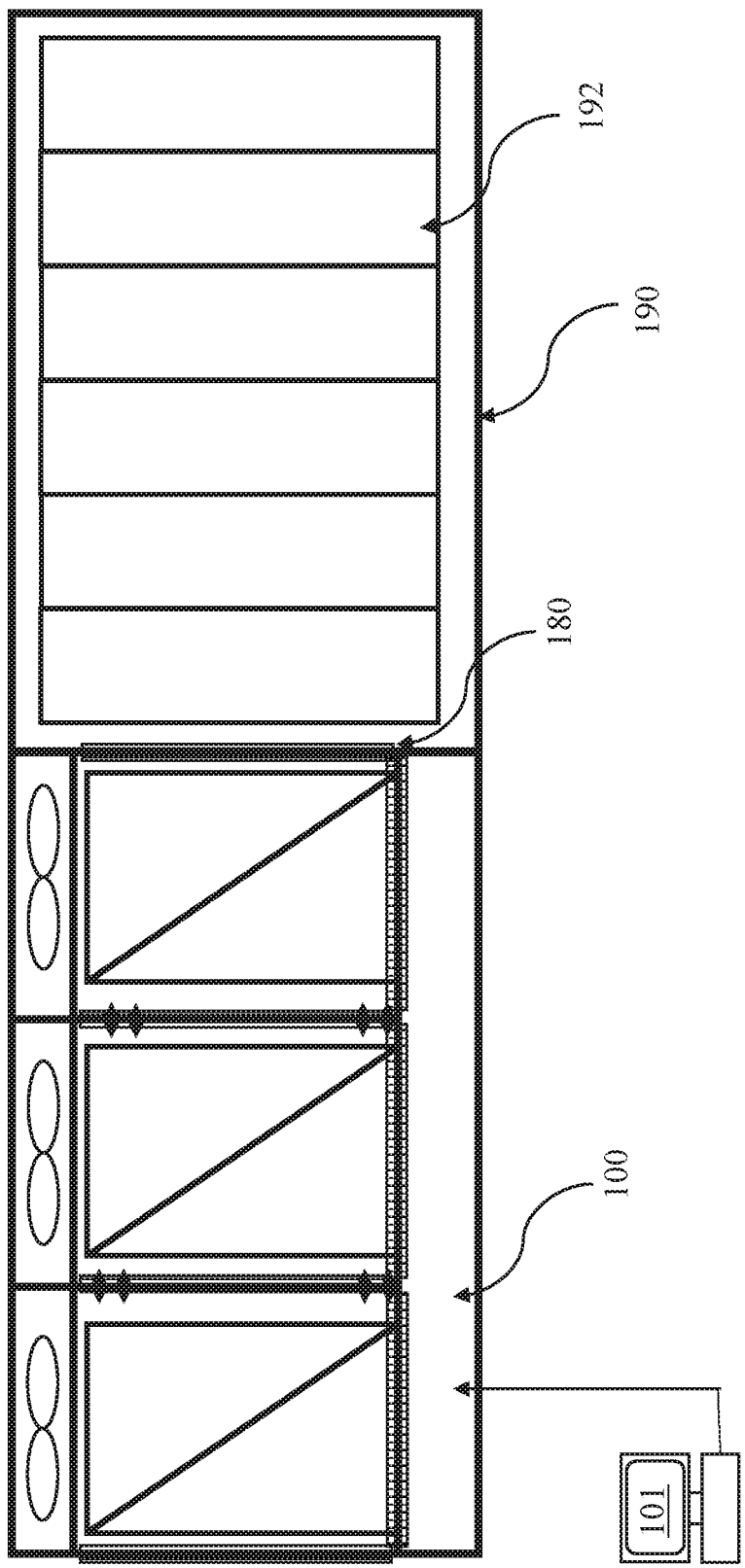
FIG. 7 is a schematic illustrating an example of the cooling system attached to an IT module, according to an embodiment.

FIG. 7 illustrates an example of the system design when the cooling module 100 is attached to an IT container 190, having IT racks 192. Notably, the full system can be assembled from different system integration vendors and tested before it is delivered to the site. Since these are highly productize solutions and designs, the system can be plug and play and start to function quickly. A common and standard interface 180 between the cooling module 100 and IT module 190, enables fast integration of the system and thereby shortens time to operation. The standard interface 180 includes standard fluid connections, air channel, etc., as needed. Also, a controller 101 may receive sensor data indicating ambient air temperature and quality and control the operational modes of the system according to the condition of the ambient air. Each of the blowers, fans, and louvers can be controlled independently by controller 101, so as to operate the system according to the operational modes selected by controller 101.

Figure 8:
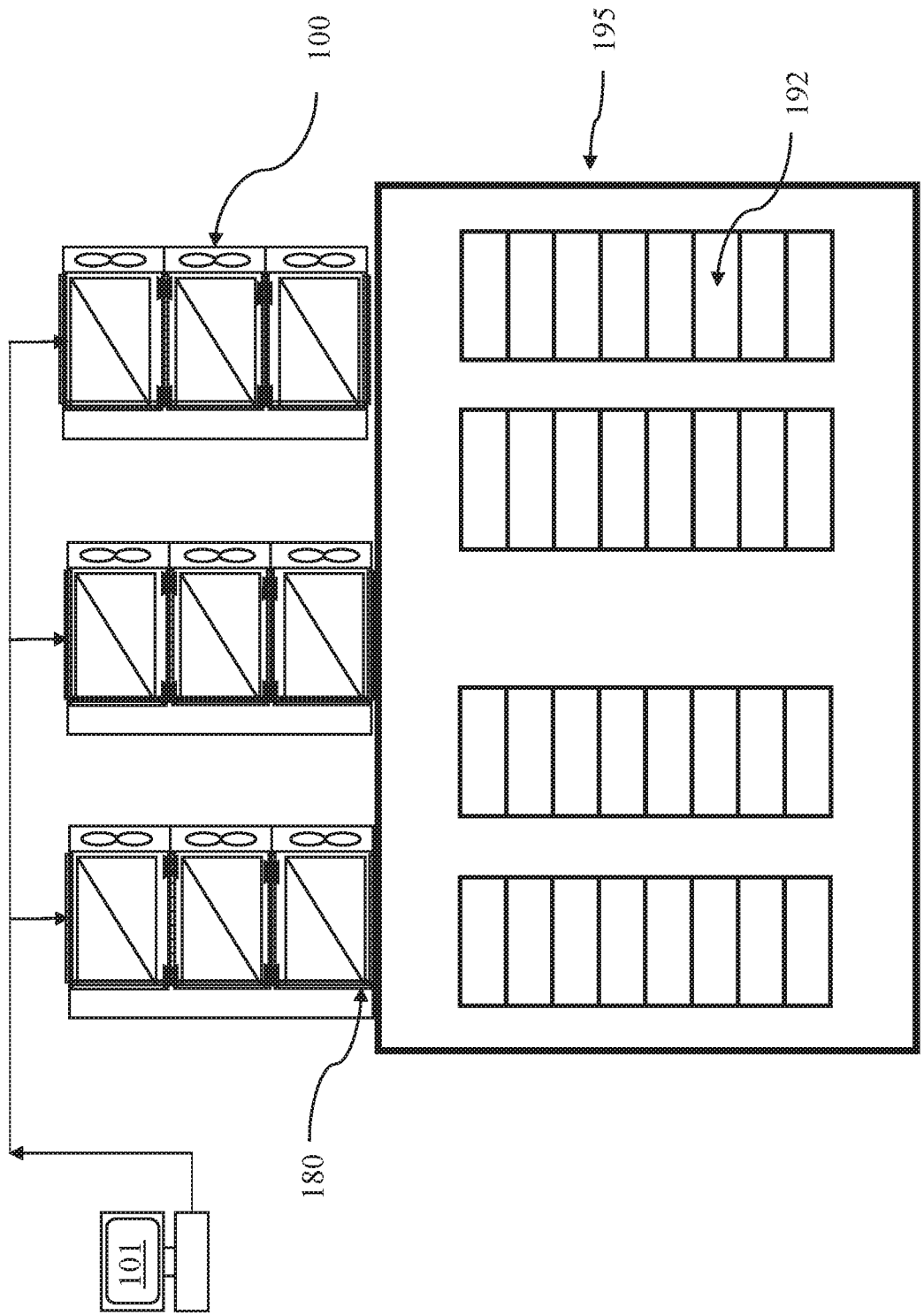
FIG. 8 is a schematic illustrating an example of the cooling system attached to a data center building, according to an embodiment.

FIG. 8 shows an example of three cooling systems 100 deployed at a data center campus 195, having IT racks 192. In this example, the cooling modules 100 are attached to the building 195 and can deliver cooling air into the building by any of the modes described herein. In this case a standard interface 180 can be used for fast integration of the system 100 into the data center building 195. Controller 101 may receive sensor data indicating ambient air temperature and quality and control the operational modes of each of the systems individually or in unison.

Figure 9:
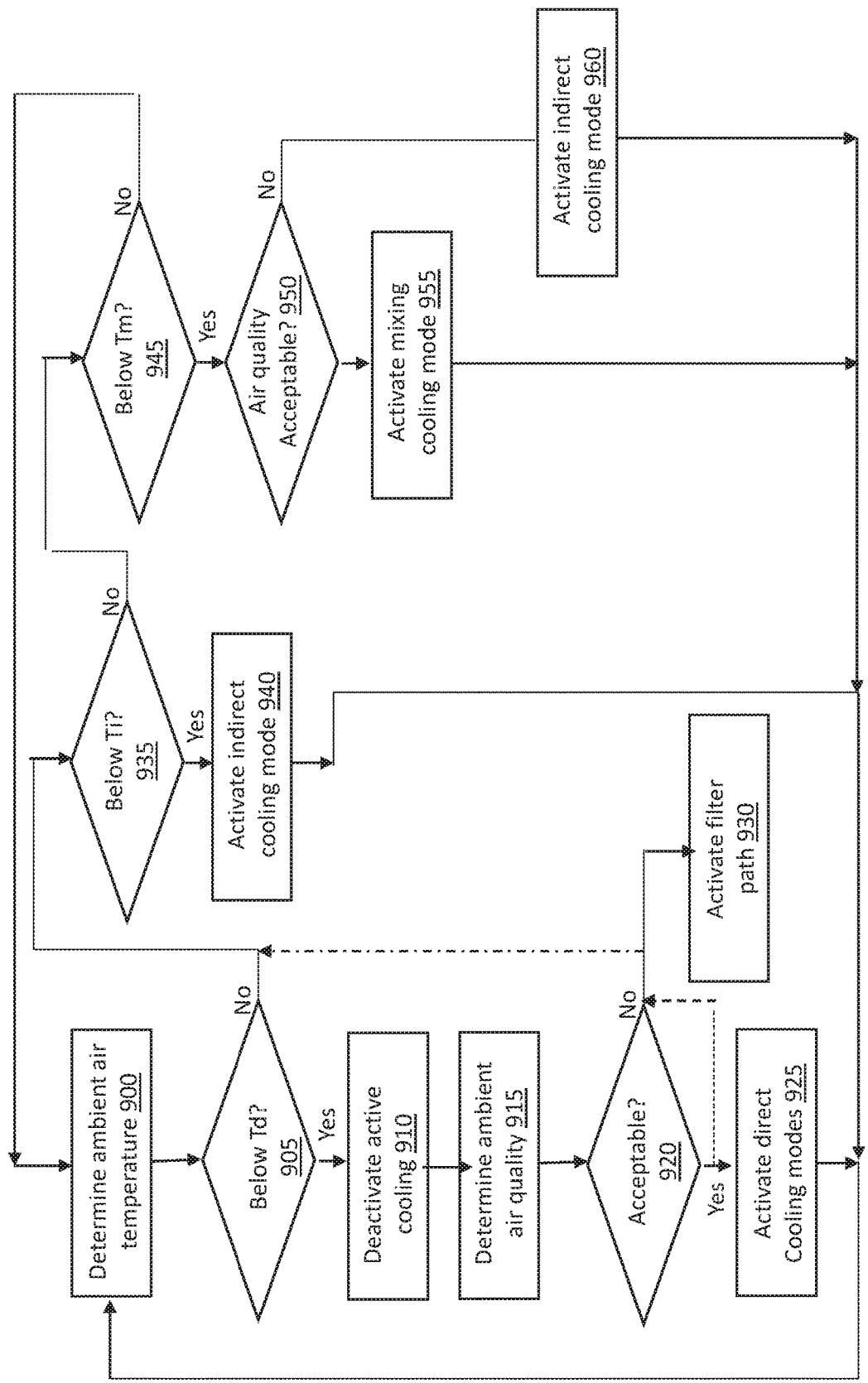
FIG. 9 is a flow chart illustrating a process according to an embodiment.

FIG. 9 is a flow chart illustrating a process according to an embodiment. The process may be programmed into a controller of the system and executed automatically by the controller. The controller may be a specially designed computing system or a general computer preprogrammed to execute the process. The operations of the process are illustrated in one particular order for purpose of illustration, however the operations may be executed in different orders than that illustrated. The flow chart also can be understood as exemplifying the system's self-acclimating process to configure the best and most efficient operational mode based on the ambient air conditions and the load requirement.

At block 900 the process obtains the outside air temperature (using dry bulb, wet bulb, etc.). It is then determined whether the air temperature is below a threshold Td that would be acceptable to deliver ambient air directly into the load. If so, at 910 active cooling systems are deactivated. At block 915 the ambient air quality is determined by, e.g., a measure of particulates in the air, a measure of smog, a measure of humidity, etc. If at block 920 it is determined that the air quality is acceptable for direct delivery, at block 925 direct cooling mode is activated. This can be accomplished by, e.g., operating the appropriate louvers and activating the proper blowers, as illustrated by ambient air in #1 shown in FIG. 2. Conversely, if in 920 it is determined that the air quality is unacceptable, at block 930 the filtering path is activated, as shown by ambient air in #2 illustrated in FIG. 2 and by FIG. 3. Also, as illustrated by the dashed arrow, it is possible to optionally activate both paths by implementing both blocks 925 and 930 simultaneously.

Block 935 may be implemented when it is determined, for example, that the ambient air temperature is insufficiently cold for direct cooling (solid-line arrow) or when it is determined that the ambient air quality is unacceptable for direct cooling (dash-dot arrow). At block 935 it is determined whether the ambient air temperature is sufficiently low for indirect cooling. If the ambient air is below the indirect cooling threshold, Ti, at block 940 the indirect cooling mode is activated by activating the air to air heat exchanger and operating the louvers, as illustrated in FIG. 4.

At block 945 it is checked whether the ambient air temperature is below a mixing threshold Tm. If it is, in block 950 it is checked whether the ambient air quality of acceptable. If air quality is acceptable, the process activates mixing cooling mode in block 955, wherein ambient air is mixed with recirculating air, as exemplified in FIG. 5. Conversely, if the air quality is unacceptable, at block 960 indirect cooling is activated by circulating the ambient air through the air to air heat exchanger to cool the recirculated air, as exemplified in FIG. 6. Optionally, filtered ambient air is delivered to separate part of the IT center, as also shown in FIG. 6.

Thus, disclosed embodiments provide a modular cooling system that can be assembled using a plurality of interconnected modules in a linear fashion, wherein the system may be operated in different modes according to specific ambient air temperature and quality, and specific facility requirements. The system includes a mixing compartment, an evaporative cooling compartment, and air supply compartment, wherein each of the compartments comprises a blower and a plurality of motorized louvers. The system further includes a return air channel having an opening for fluid communication to the mixing compartment. The evaporative cooling compartment includes an air-to-air heat exchanger and a water evaporative system. The water evaporative system may also supply water to misting nozzles in the air supply compartment. The evaporative cooling compartment may also include side intake having opening to the ambient environment. The sir supply compartment may include water misting system and at least one fan. The system further includes fluid passages from the mixing compartment to the evaporative cooling compartment and from the evaporative cooling compartment to the air supply compartment.

Disclosed embodiments also provide a method for operating a cooling system of a data center, the system including a plurality of blowers, a plurality of motorized louvers, a heat exchanger, and air filter, the method comprising setting a plurality of operational modes, wherein each mode includes activation settings for the plurality of blowers and plurality of louvers, the operational mode including: a direct mode wherein the heat exchanger is deactivated and the plurality of blowers and plurality of louvers are activated to deliver ambient air directly to the load; an indirect mode wherein the heat exchanger is activated and the plurality of blowers and plurality of louvers are activated to deliver ambient air to the heat exchanger; and mixing mode, wherein the heat exchanger is deactivated and the plurality of blowers and plurality of louvers are activated to mix ambient air with recirculated air; the method further comprising determining ambient air temperature and ambient air quality and activating one of the cooling modes according to the determined ambient air temperature and ambient air quality.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An airside economizer cooling system for data center, the system configurable and operable in different modes according to ambient air conditions, including humidity, temperature and quality, the system comprising:
a mixing module, an evaporative cooling module, and an air supply module, attached to each other and having air passages there-between, wherein a first air passage between the mixing module and the evaporative cooling module includes a first motorized louver and a second air passage between the evaporative cooling module and the air supply module includes a second motorized louver;
the mixing module comprising a housing, an ambient air blower attached to the housing, and at least one motorized louver;
the evaporative cooling module comprising a housing, an exhaust blower attached to the housing, a heat exchanger, evaporative nozzle and water system, and an ambient air inlet;
the air supply module comprising a housing, intake blower attached to the housing, a filter positioned between the intake blower and the housing, and facility interface delivering cold air to the data center; and
a return air channel having an opening delivering return air from the data center to the mixing module.

2. The cooling system of claim 1, wherein the mixing module, the evaporative cooling module, and the air supply module are attached to each other serially to form a linear assembly.

3. The cooling system of claim 1, wherein the mixing module comprises an upper compartment attached to the ambient air blower and a bottom compartment attached to the return air channel.

4. The cooling system of claim 3, wherein the bottom compartment comprises an exhaust louver for exhausting the return air to ambient environment.

5. The cooling system of claim 4, wherein the bottom compartment further comprises return louver directing the return air into the evaporative cooling module.

6. The cooling system of claim 1, wherein the evaporating cooling module comprises a first air passage defining fluid path from the ambient air inlet through the heat exchanger and to the exhaust blower, and a second air passage defining fluid path from the mixing module to the air supply module.

7. The cooling system of claim 1, wherein the air supply module comprises a top compartment and a bottom compartment, wherein the filter is positioned between the intake blower and the top compartment.

8. The cooling system of claim 7, wherein the air supply module further comprises a water misting nozzle within the top compartment.

9. The cooling system of claim 8, wherein at least one of the top compartment and bottom compartment comprises a fan arrangement positioned at the facility interface.

10. An airside economizer cooling system for data center, the system configurable and operable in different modes according to ambient air temperature and ambient air quality, the system comprising:
a mixing module, an evaporative cooling module, and an air supply module, attached to each other and having air passages there-between;
a plurality of blowers, each attached to one of the mixing module, the evaporative cooling module, and the air supply module;
a plurality of motorized louvers, at least one motorized louver attached to each one of the mixing module, the evaporative cooling module, and the air supply module, wherein a first air passage between the mixing module and the evaporative cooling module includes a first motorized louver and a second air passage between the evaporative cooling module and the air supply module includes a second motorized louver;
a heat exchanger positioned within the evaporative cooling module;
return air channel having fluid opening to the mixing module; and,
a controller receiving ambient air data and using the ambient air data to control the cooling system to alternatingly operate in one of: direct mode delivering ambient air directly to a load, indirect mode delivering ambient air to the heat exchanger, mixing mode delivering ambient air to mix with return air delivered by the return air channel, and hybrid mode delivering ambient air partly to the heat exchanger and partly to the load.

11. The system of claim 10, wherein the controller is preprogrammed to selectively activate the plurality of blowers independently according to selected mode.

12. The system of claim 10, wherein the controller is preprogrammed to selectively activate the plurality of motorized louvers to form different air paths wherein a first path delivers the ambient air directly to the load, a second path delivers the ambient air to the heat exchanger, a third path delivers the ambient air to mix with the return air delivered by the return air channel, and a fourth path delivers the ambient air partly to the heat exchanger and partly to the load.

13. The system of claim 10, wherein a first blower of the plurality of blowers is mounted onto the mixing module and is operable to deliver ambient air into the mixing module; a second blower of the plurality of blowers is mounted onto the evaporative cooling module and is operable to deliver ambient air to the heat exchanger; and a third blower of the plurality of blowers is mounted onto the air supply module and is operable to deliver ambient air through a filter.

14. The system of claim 10, wherein the load comprises a first load and a second load and the air supply module comprises an upper compartment defining a first air delivery path to the first load, and a lower compartment defining a second air delivery path to the second load separate from the first air delivery path.

* * * * *